United States Patent [19]

Rao

[11] 4,442,362
[45] Apr. 10, 1984

[54] SHORT PULSE GENERATOR

[75] Inventor: Basrur R. Rao, Lexington, Mass.

[73] Assignee: Sperry Corporation, New York, N.Y.

[21] Appl. No.: 378,558

[22] Filed: May 17, 1982

[51] Int. Cl.³ ............................................. H03K 3/00
[52] U.S. Cl. ...................................... 307/108; 363/61
[58] Field of Search ............... 307/106, 108, 109, 110; 328/67; 363/59, 60, 61

[56] References Cited

U.S. PATENT DOCUMENTS

| 3,513,328 | 5/1970 | Auger, Jr. | 307/108 |
| 3,832,568 | 8/1974 | Wang | 307/106 |
| 3,878,450 | 4/1975 | Greatbatch | 307/110 X |

OTHER PUBLICATIONS

Mallory, "Capacitors add up in Voltage Multiplier", Electronics Mar. 2, 1970.
Chetty, "Multiplier Boosts Voltage n Times with n-1 Stages", EDN, Mar. 5, 1978.

Primary Examiner—Elliot A. Goldberg
Assistant Examiner—D. Jennings
Attorney, Agent, or Firm—Howard P. Terry; Seymour Levine

[57] ABSTRACT

A baseband generator for pulses of high peak amplitude, rapid rise time, subnanosecond duration, and high pulse repetition frequency is disclosed. A plurality of capacitors are charged in parallel then discharged in series to cause a plurality of avalanche of transistors to fire sequentially. The resulting sum voltage across the capacitors is then applied to a step recovery diode to generate the pulse.

7 Claims, 4 Drawing Figures

SHORT PULSE GENERATOR

BACKGROUND OF THE INVENTION

1. Field of the Invention

The subject invention pertains to the field of short pulse generators and, more particularly, to generators for providing high amplitude high repetition rate pulses with fast on-off times, and pulse duration in the order of nanoseconds.

2. Description of the Prior Art

Early prior art short pulse generators utilized a mercury relay switch to discharge a transmission line which had been charged to a high voltage through a long time constant. This technique is capable of providing subnanosecond pulses with rise times in the order of 100 picoseconds at peak pulse voltages in the order of several hundred volts. These switches, however, cannot be operated at very high duty cycles because of mechanical limitations of a vibrating reed used therein for the switching operation. Additionally, the mechanical contacts tend to deteriorate, resulting in jittery and noisy pulses. Since the deterioration of the mechanical contacts is proportional to the number of times the contacts are being opened and closed, the life of the switch is inversely proportional to the duty cycle.

Another technique employed in the early prior art utilized Hertzian (spark gap) generators. These devices can supply pulses with amplitudes in the order of 1,000 volts and rise times in the order of 100 picoseconds at repetition frequencies above 200 Hertz. Hertzian generators however, have a lifetime limited by the width of the spark gap which determines the width of the generated pulse.

One obvious solution to the mechanical and lifetime limitations of the mercury and Hertzian generators is to utilize solid state devices which are rapidly switchable and extremely reliable. It is well known that tunnel diodes, avalanche transistors, and step recovery diodes can be used to generate a series of impulse functions at a repetition rate substantially equal to the frequency of a driving function. Nanosecond pulses with rise times in the order of 25 picoseconds are achievable with tunnel diodes. These generators, however, are low amplitude devices achieving levels only in the order of 0.5 volts. Short pulses with amplitudes as high as 1,000 volts have been generated with a series stack of avalanche transistors. The rise and fall times of these generators is in the order of 6 nanoseconds, which for many applications is too slow. A significant improvement in the pulse rise time has been achieved with the combination of avalanche transistors and step recovery diodes. These devices exhibit rise times in the order of 100 picoseconds, but provide peak amplitudes only in the order of 25 volts. A device, comprising a multiplicity of serially coupled step recovery diodes, capable of providing pulse widths of 200 picoseconds and pulse amplitudes in excess of 180 volts is disclosed in U.S. Pat. No. 3,832,568 issued Aug. 27, 1974 to C. C. Wang and assigned to the assignee of the present invention. The high pulse amplitudes of this device, however, are achieved only when the pulse generator is operating into a high impedance resonant load. Additionally, pulse repetition rate of the device is limited to frequencies in the order of 40 kHz.

SUMMARY OF THE INVENTION

A solid state generator for providing a high voltage, subnanosecond rise time pulse of substantially nanosecond duration in accordance with the principles of the present invention may comprise a step recovery diode fired by the discharge of three capacitors. The three capacitors are charged in parallel and then, by means of fast switching avalanche transistors, are connected in series for discharge to obtain a voltage that is substantially equal to the sum of the capacitor voltages when charged. The series coupled capacitors are then coupled via an output avalanche transistor to a differentiator, causing a doublet pulse to be coupled to the step recovery diode. This doublet pulse triggers the step recovery diode stack to provide a fast rise time high voltage negative pulse of substantially nanosecond duration.

DESCRIPTION OF THE PREFERRED EMBODIMENTS

Figure 1:
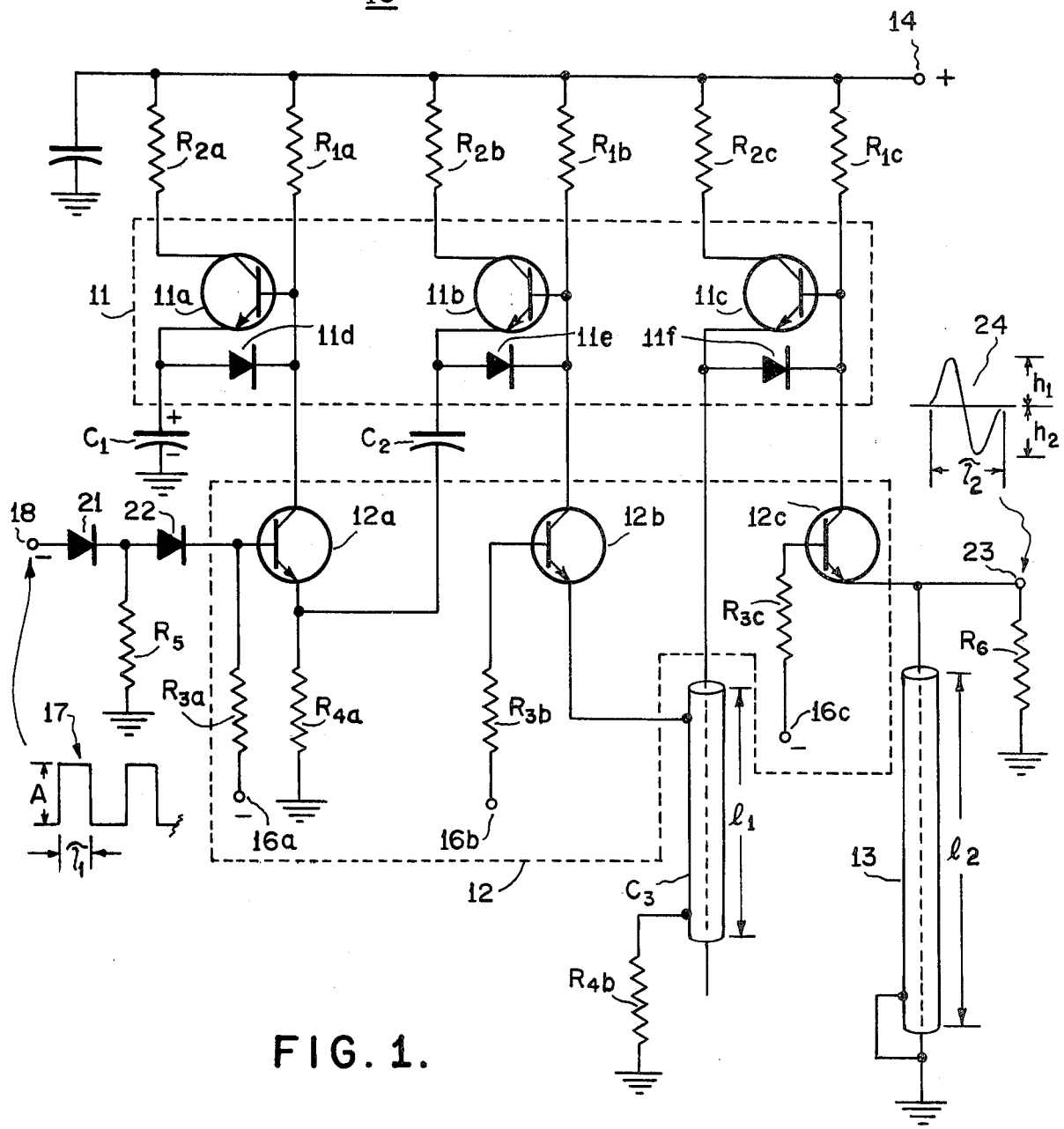
FIG. 1 is a schematic diagram of a driver circuit for a pulse generator embodying the principles of the invention.

Referring to FIG. 1, a driver 10 that may be utilized for a short pulse generator in accordance with the present invention may comprise a charging circuit 11, a switching circuit 12, a pulse shaping circuit 13, and three capacitors $C_1$, $C_2$, and $C_3$. The driver 11 may include transistors 11a, 11b, and 11c coupled in parallel respectively to diodes 11d, 11e, and 11f. Each transistor 11a through 11c may be of the type known in the art as MPS U10, while each of the diodes 11e through 11f may be of the type known in the art as 1N914. The junction of the cathode of the diode and the base of the transistors for the parallel pairs 11a–11d, 11b–11e, and 11c–11f are coupled via resistors $R_{1a}$, $R_{1b}$, and $R_{1c}$ respectively and terminal 14 to a power supply (not shown); while the junction of the emitter of the transistor and the anode of the diode of these transistor-diode pairs are respectively coupled to the capacitors $C_1$, $C_2$, and $C_3$ and the collectors of the transistors 11a, 11b, and 11c are respectively coupled to the terminal 14 via resistors $R_{2a}$, $R_{2b}$ and $R_{2c}$. Capacitors $C_1$, $C_2$, and $C_3$ are charged in parallel from terminal 14 by current flowing through the corresponding transistors. The charging period is quite rapid since the current required for charging and capacitors is effectively multiplied by the $\beta$ of the transistors. Current continues to flow through the transistors charging the capacitors until the leakage current through the diode, of each transistor-diode parallel combination, and the corresponding avalanche transistor of the switch 12, as for example transistor 12a for the transistor diode parallel combination 11a–11d, back biases the base of the transistor. When this condition is reached the transistors 11a, 11b, and 11c are turned off. This operation charages capacitors $C_1$, $C_2$, and $C_3$ in parallel to the supply voltage at terminal 14, which may be 230 volts.

During the charging period and at the completion thereof, the avalanche transistors 12a, 12b, and 12c are substantially at cut off, by virtue of −6 V coupled to the gate thereof from terminals 16a, 16b, and 16c via resistors $R_{3a}$, $R_{3b}$, and $R_{3c}$ respectively, only leakage current flowing therethrough. A positive trigger pulse, from a series of positive trigger pulses 17, coupled via terminal 18 and diodes 21, 22 to the base of transistor 12a causes transistor 12a to avalanche, thereby placing capacitor $C_1$ in series with capacitor $C_2$ and establishing a voltage level at the anode of diode 11e that is the sum of voltages across the capacitors $C_1$ and $C_2$. This sum voltage causes diode 11e to conduct, placing the sum voltage on the collector of the transistor 12b. The sum voltage over volts transistor 12b causing it to avalanche, thereby placing the three capacitors $C_1$, $C_2$, and $C_3$ in series and establishes a voltage at the anode of diode 11f that causes it to conduct thereby coupling the sum voltage of all three capacitors to the base of transistor 12c. The sum of the voltages across the three capacitors causes transistor 12c to avalanche, thus completing the circuit to ground via pulse shaping network 13 which may be a length of coaxial cable, such as RG, 141/U, shorted at one end, wherethrough capacitors $C_1$, $C_2$, and $C_3$ are discharged thereby providing a pulse at the output terminal 23.

The shape of the output pulse is determined by the smallest capacitor in a series chain, which, for example, may be the capacitor $C_3$. This capacitor may be formed by a short length of semi-rigid RG 141/U cable with an open circuit termination. The discharged time for this capacitor determines the pulse width and is given by $2l_1/v_1$, where $l_1$ is the length of the cable and $v_1$ is the velocity of propagation therein. RG 141/U cable possesses approximately picofarad per centimeter and will provide a pulse width of approximately 2 nanoseconds when $l_1$ is substantially 5.3 centimeters.

When transistor 12c avalanches, one-half the discharged energy from the capacitors $C_1$ through $C_3$ is coupled to the output terminal 23 and one-half is coupled to the pulse shaper 13, which may comprise a shorted coaxial line of length $l_2$. Signals coupled to the pulse shaper 13 propagate to the shorted end thereof, experience a phase reversal thereat, and are reflected from the short arriving at the input end after a time lapse of $2l_2/v_2$, where $v_2$ is the propagation velocity along the transmission line comprising the pulse shaper 13. At the time the symbol returns to the input end of the pulse shaper 13, transistor 12c is cut off causing the reflected pulse from the pulse shaper 13 to be coupled to the output terminal 23, thereby establishing a doublet pulse 24 thereat. The doublet pulse 24 will have a positive peak amplitude $h_1$ substantially equal to 120 V, a negative peak amplitude $h_2$ substantially equal to 65 V and a total width $\tau_2$ substantially equal to four nanoseconds, one cycle of a 250 MHz wave, when, in addition to the parameters previously stated, the circuit components have the following values:

$R_{1a,b,c} = 150{,}000$ ohms
$R_{2a,b,c} = 680$ ohms
$R_{3a,b,c} = 10{,}000$ ohms
$R_{4a,b} = 5{,}000$ ohms
$R_5 = 2{,}000$ ohms
$C_{1,2} = 150$ picofarads
$A = 4$ volts
$\tau_1 = 15$ microseconds
$l_2 = 15.3$ centimeters A matching resistor $R_6$ may be coupled to the output terminal 23 when an output pulse that is substantially ring free is desired. This resistor, when of appropriate value, generally 50 ohms, substantially eliminates multiple reflections between the transistor 12c and the output port 23. Though this resistor significantly improves the pulse shape at the output terminal 23, it concomitantly decreases the peak pulse amplitude thereat and should be used only when a substantially ring free output pulse is desired.

At the completion of the doublet pulse, which for the parameters given above may be considered as one cycle of a 250 MHz wave, the transistors 12a, 12b, and 12c are cut off, transistors 11a, 11b, and 11c are conducting, and capacitors $C_1$, $C_2$, and $C_3$ are being recharged to repeat the above described process upon the reception of a subsequent pulse in the pulse train 17.

Figure 2:
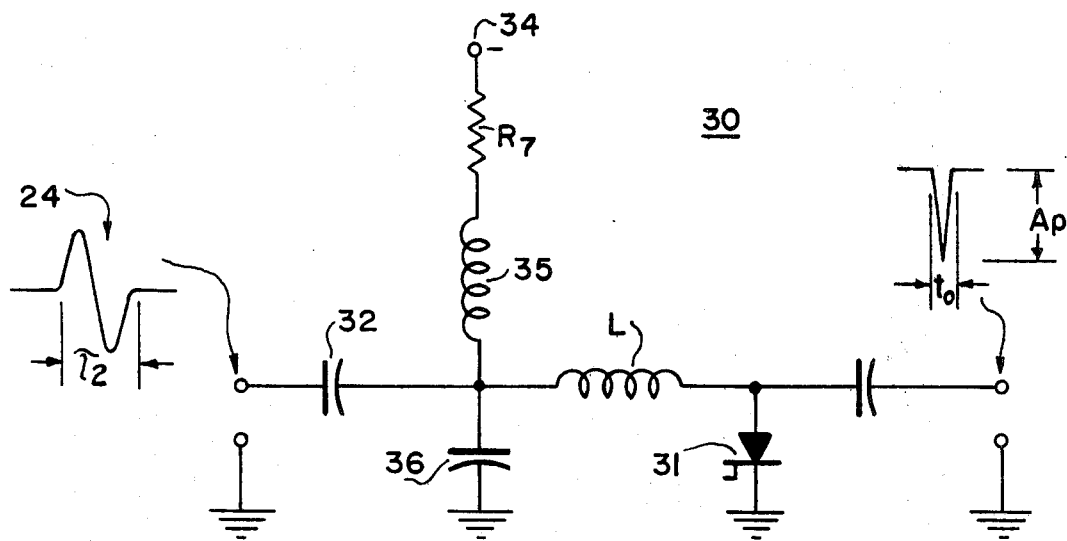
FIG. 2 is a schematic diagram of a pulse generator, embodying the principles of the present invention, that is responsive to the driver circuit of FIG. 1.
Figure 3:
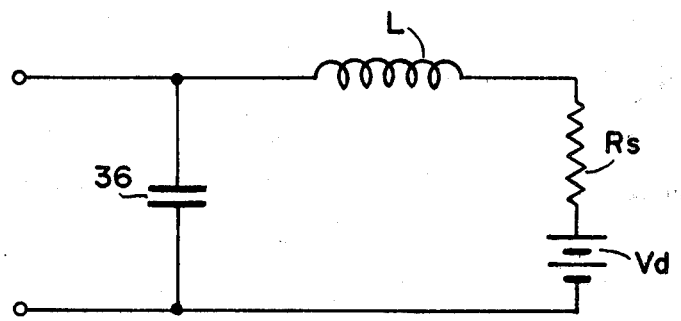
FIG. 3 is an equivalent circuit for the pulse generator of FIG. 2 that is valid during the charging interval.
Figure 4:
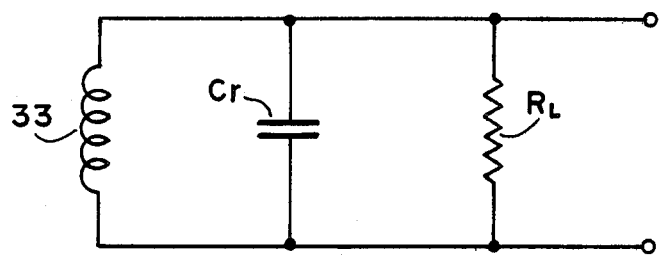
FIG. 4 is an equivalent circuit for the pulse generator of FIG. 2 that is valid during the impulse interval.

Referring now to the short pulse generator 30 of FIG. 2, the doublet pulse 24 is coupled to a step recovery diode (SRD) 31 via a capcitor 32 and an inductance L. A negative bias voltage, which may be −6 volts, is coupled via terminal 34, resistors $R_7$ and a choke inductance 35 to the SRD31 to establish an initial non-conducting state. A capacitor 36 is coupled between ground and the junction of choke 35 with the inductance L. When the positive half cycle of the doublet pulse 24 is coupled to SRD31, it is rapidly switched into its conducting state, thereby providing a low resistance path to ground. An equivalent circuit for this condition is shown in FIG. 3, wherein $V_d$ is the voltage drop across SRD31 and $R_s$ is its series resistance in its conducting state. During its forward conducting state minority carriers are stored in SRD31. These minority carriers are completely removed during the negative half cycle of the doublet, abruptly the SRD31 to cut off. This abrupt cessation of the diode current causes the energy stored in the magnetic field of the inductance L to produce a half sinusoid voltage impulse across the SRD31 at the resonant frequency of the combination inductance L and the reverse bias capcitance $C_r$ of the SRD31. The equivalent circuit for this period of operation is shown in FIG. 4, wherein $R_L$ is the load resistance. During this transition the capacitor 36 effectively provides a short to ground, thus coupling the inductance L in parallel with the capacitor $C_r$ and the load resistance $R_L$. With this circuit the impulse delivered cross the load resistance $R_L$ has a duration $t_o$ given by:

$$t_o = \frac{\pi \sqrt{LC_r}}{\sqrt{1 - \dfrac{L}{4R_L^2 C_r}}}$$

SRD31 may be a MA 44483 manufactured by Microwave Associates of Burlington, Mass. The reverse bias capacitance of this device is in the order of 1.4 picofarads. Utilizing this capacitance, an impulse width in the order of picoseconds may be realized with an inductance L of 6 nanoseconds and a load resistance $R_L$ of 50 ohms. In the actual circuit parasitic capacitances cause the pulse width to be in the order of 400 picoseconds. The peak amplitude $A_p$ of the pulse obtained with this circuit was in the order of 100 volts at a pulse repetition frequency of 100 KHz, the repetition frequency of the trigger pulse sequence.

While the invention has been described in its preferred embodiments, it is to be understood that the words which have been used are words of description rather than limitation and that changes may be made within the purview of the appended claims without departing from the true scope and spirit of the invention in its broader aspects.

I claim:

1. An appartus for generating signals of short duration comprising:

charging means having a conducting state and a nonconducting state for supplying energy at an output means thereof while in said conducting state and including a plurality of unidirectional current conductive devices poled to set said charging means to said nonconducting state when said energy supplied achieves a predetermined level;

a plurality of chargeable energy storage devices coupled to said unidirectionl current conductive devices and said charging means such that all are charged from said charging means substantially simultaneously to achieve said predetermined energy level;

switch means having a conducting state and a nonconducting state, and coupled to said plurality of energy storage devices for coupling said energy storage devices substantially in series when in said conducting state; and pulse shaper means coupled to said energy storage devices by said switch means during said conduction state of said switch means for providing an energy discharge path for energy stored in said storage devices and for providing an output signal representative of said energy discharge from said energy storage devices.

2. An apparatus in accordance with claim 1 wherein each energy storage device of said plurality of energy storage devices is a capacitor.

3. An apparatus in accordance with claim 2 wherein said charging means comprises:

terminal means for coupling to a source of electrical energy, and a plurality of transistors each having an emitter coupled to one of said plurality of capacitors, a collector coupled to said terminal means, and a base, and wherein said plurality of unidirectional current conductive devices are each coupled between said base and said emitter of a corresponding transistor and poled so that at a predetermined charge level of said capacitor coupled to said emitter current flows through said unidirectional current conductive device to set said transistor corresponding to said unidirectional current conductive device in said nonconducting state; and said switch means comprises:

a plurality of transistors, each having a collector coupled to said base of a corresponding one of said transistors of said charging means, an initial transistor of said switch means through a penultimate transistor thereof, each having an emitter coupled through one of said capacitors to said emitter of a noncorresponding transistor of said switch means having a base coupled to receive trigger pulses and an ultimate transistor of said switch means having an emitter coupled to said pulse shaper means.

4. An apparatus in accordance with claim 3 wherein said pulse shaper means comprises a coaxial cable of predetermined length having an inner conductor coupled to said emitter of said ultimate transistor of said switch means at a first end and an outer conductor coupled to said inner conductor at a second end.

5. An apparatus in accordance with claims 1, 2, 3, or 4 wherein one of said capacitors comprises a coaxial cable having an inner conductor coupled to said charging means and an outer conductor coupled to said switch.

6. An apparatus in accordance with claim 5 further including bistate means coupled to said pulse shaper means for switchably providing a conducting state when said signal at said pulse shaper means is of a first polarity and to a non-conducting state when said signal of said pulse shaper means is of a second polarity that is opposite said first polarity;

inductive means having a first port coupled to said pulse shaper means and a second port coupled to said bistate means for storing energy when said bistate means is in said conducting state and for discharging said stored energy when said bistable means is in said nonconducting state.

7. An apparatus in accordance with claim 6 wherein said inductor means has an inductance value L and said bistate means is a step recovery diode having a reversed capacitance of value $C_r$, said reversed capacitance and said inductor means coupled in parallel relationship during said nonconducting state, thereby providing a voltage impulse that is half of a resonant frequency determined by a parallel combination of a capacitor of value $C_r$ and an inductance of value L.

* * * * *